United States Patent
Oesterholt et al.

(10) Patent No.: US 7,239,368 B2
(45) Date of Patent: Jul. 3, 2007

(54) USING UNFLATNESS INFORMATION OF THE SUBSTRATE TABLE OR MASK TABLE FOR DECREASING OVERLAY

(75) Inventors: Rene Oesterholt, 's-Hertogenbosch (NL); Ralph Brinkhof, Eindhoven (NL); Tjarko Adriaan Rudolf Van Empel, Eindhoven (NL); Leon Martin Levasier, Hedel (NL); Joost Jeroen Ottens, Veldhoven (NL); Koen Jacobus Johannes Maria Zaal, Eindhoven (NL); Koenraad Stephan Silvester Salden, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 216 days.

(21) Appl. No.: 10/998,179

(22) Filed: Nov. 29, 2004

(65) Prior Publication Data

US 2006/0114436 A1    Jun. 1, 2006

(51) Int. Cl.
G03B 27/32     (2006.01)
G03B 27/68     (2006.01)

(52) U.S. Cl. .......................................... 355/52; 355/77
(58) Field of Classification Search ................. 355/52, 355/53, 55, 72, 75, 77
See application file for complete search history.

(56) References Cited

U.S. PATENT DOCUMENTS

| 5,191,200 A | 3/1993 | van der Werf et al. |
| 6,597,434 B2 * | 7/2003 | Van Dijsseldonk .......... 355/75 |
| 6,924,884 B2 * | 8/2005 | Boonman et al. ............. 355/55 |
| 6,950,176 B1 * | 9/2005 | LaFontaine et al. .......... 355/75 |

* cited by examiner

Primary Examiner—Rodney Fuller
(74) Attorney, Agent, or Firm—Pillsbury Winthrop Shaw Pittman, LLP

(57) ABSTRACT

A lithographic system includes an illumination system for providing a projection beam of radiation, a mask table for supporting a mask, the mask serving to impart the projection beam with a pattern in its cross-section, a substrate table for holding a substrate, and a projection system for projecting the patterned beam onto a target portion of the substrate. The system also comprises a processor arranged to calculate overlay corrections using a reference height map representing a surface of the substrate table or the mask table. Feed forward correction of non-flatness induced wafer grid distortion is allowed during alignment and during exposure, thereby reducing overlay errors caused by differences in flatness characteristics. It provides an indirect qualification method for overlay accuracy related to exposure chuck flatness based on height map information.

13 Claims, 6 Drawing Sheets

USING UNFLATNESS INFORMATION OF THE SUBSTRATE TABLE OR MASK TABLE FOR DECREASING OVERLAY

FIELD OF THE INVENTION

The present invention relates to lithographic systems and device manufacturing methods using such system.

BACKGROUND

A lithographic system is a machine that applies a desired pattern onto a target portion of a substrate. Lithographic systems may be used, for example, in the manufacture of integrated circuits (ICs). In that circumstance, a patterning device, which is alternatively referred to as a mask or a reticle, may be used to generate a circuit pattern corresponding to an individual layer of the IC, and this pattern may be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic systems include so-called steppers, in which each target portion is irradiated by exposing an entire pattern onto the target portion in one exposure, and so-called scanners, in which each target portion is irradiated by scanning the pattern through the projection beam in a given direction (the "scanning"-direction) while synchronously scanning the substrate parallel or anti-parallel to this direction.

A substrate may be elastically deformed (bent) by a substrate table that is not flat. Bending of the substrate will induce overlay errors through distortion of the wafer grid. This wafer grid is defined by lines in two orthogonal directions, referred to as the X- and Y-directions. To ensure good overlay, the substrate table should be as flat as possible from chuck to chuck (i.e. from one chuck to another chuck in a single machine, and from one chuck to another chuck in different machines) and it must not change over time. The flatness of the exposure chuck is a resulting characteristic from the flatness of the individual hardware components in the chuck assembly, with the substrate table acting as the interface supporting the wafer. Flatness differences may be introduced through manufacturing tolerances, wear of components or introduction of defects and/or contamination during the lifetime. The impact on overlay of the substrate table not being flat is two-fold. The local wafer grid distortion due to a non-flat surface will cause global alignment errors that are non-representative for the wafer grid. The wafer grid may be deformed locally resulting in a (different) 2-dimensional grid 'fingerprint' (i.e. a chuck specific systematic distortion induced by the chuck non-flatness) with random residual field translations and/or local field expansion or rotational errors per field.

Overlay may also be caused by a non-flatness of the mask table.

SUMMARY

The invention decreases overlay between two consecutive imaged layers of a substrate in a lithographic system by correcting for non-flatness of substrate and/or the mask table.

According to one embodiment of the invention, there is provided a lithographic system comprising an illumination system for providing a projection beam of radiation, a mask table for supporting a patterning device, the patterning device serving to impart the projection beam with a pattern in its cross-section a substrate table for holding a substrate, and a projection system for projecting the patterned beam onto a target portion of the substrate, characterized in that the apparatus comprises a processor arranged to calculate overlay corrections using a first reference height map representing a surface of the substrate table and/or a second reference height map representing a surface of said mask table.

According to a further embodiment of the invention, there is provided a device manufacturing method comprising the steps of arranging a substrate on a substrate table, arranging patterning device on a mask table, providing a projection beam of radiation using an illumination systems, using the patterning device to impart the projection beam with a pattern in its cross-section, and projecting the patterned beam of radiation onto a target portion of the substrate.

Overlay corrections may be calculated using a first reference height map representing a surface of the substrate table and/or a second reference height map representing a surface of the mask table.

The overlay corrections may be implemented while performing the projecting.

According to another embodiment of the invention, there is provided a computer program product configured to enable the computer to perform the following actions: determine a first reference height map representing a surface of a substrate table of the lithographic apparatus and/or a second reference height map representing a surface a mask table of the lithographic apparatus, calculate overlay corrections using the first and/or the second reference height map, and control the lithographic apparatus during exposures using the overlay corrections.

According to another embodiment of the invention, a data carrier is provided that includes the computer program product.

Although specific reference may be made to the use of lithographic systems in the manufacture of ICs, it should be understood that the lithographic systems described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed before or after exposure in, for example, a track (a tool that typically applies a layer of resist to a substrate and develops the exposed resist), a metrology tool, or an inspection tool. Where applicable, the invention may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to devices that may be used to impart a projection beam with a pattern in its cross-section such as to create a pattern in a target portion of the substrate.

It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions; in this manner, the reflected beam is patterned.

The support structure supports, i.e. bares the weight of, the patterning device. It holds the patterning device in a way depending on the orientation of the patterning device, the design of the lithographic system, and other conditions, such as, for example, whether or not the patterning device is held in a vacuum environment. The support may be using mechanical clamping, vacuum, or other clamping techniques, for example, electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic system may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic system may also be of a type wherein the substrate is immersed in a liquid having a relatively high refractive index, e.g. water, so as to fill a space between the final element of the projection system and the substrate. Immersion liquids may also be applied to other spaces in the lithographic system, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
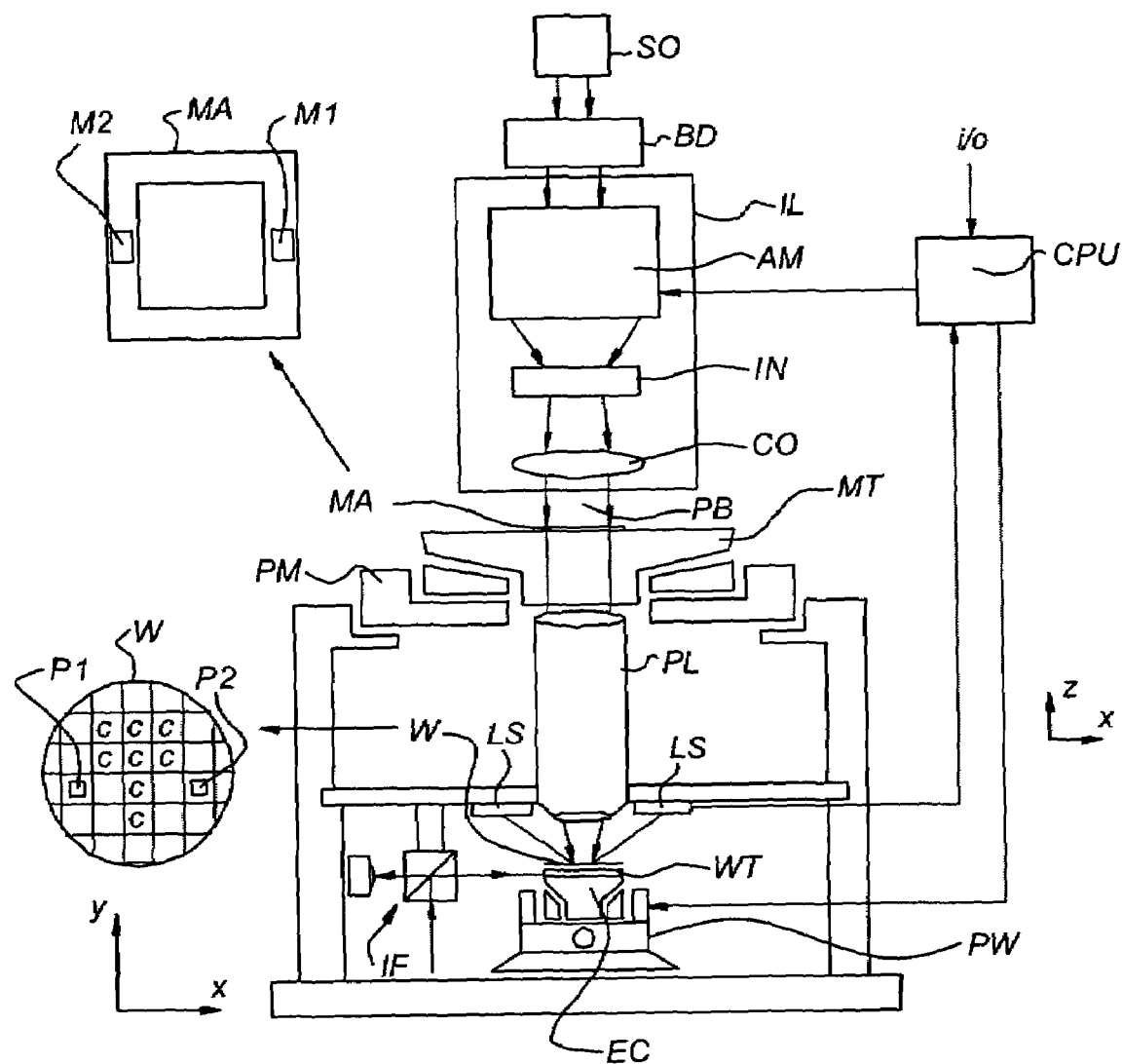
FIG. 1a illustrates a lithographic system according to an embodiment of the invention.

FIG. 1a schematically depicts a lithographic system according to a particular embodiment of the invention. The apparatus is of a transmissive type (e.g. employing a transmissive mask). The apparatus comprises:

- an illumination system (illuminator) IL for providing a projection beam PB of radiation.
- a first support structure (e.g. a mask table) MT for supporting a patterning device (e.g. a mask) MA and connected to first positioning means PM for accurately positioning the patterning device with respect to item PL;
- an exposure chuck EC with a substrate table (e.g. a wafer table) WT on top for holding a substrate (e.g. a resist-coated wafer) W and connected to second positioning means PW for accurately positioning the substrate W with respect to item PL; and
- a projection system (e.g. a refractive projection lens) PL for imaging a pattern imparted to the projection beam PB by patterning device MA onto a target portion C (e.g. comprising one or more dies) of the substrate W.

The illuminator IL receives a beam of radiation from a radiation source SO. The source and the lithographic system may be separate entities, for example when the source is an excimer laser. In such cases, the source is not considered to form part of the lithographic system and the radiation beam is passed from the source SO to the illuminator IL with the aid of a beam delivery system BD comprising for example suitable directing mirrors and/or a beam expander. In other cases the source may be integral part of the system, for example when the source is a mercury lamp. The source SO and the illuminator IL, together with the beam delivery system BD if required, may be referred to as a radiation system. The illuminator IL may comprise adjusting means AM for adjusting the angular intensity distribution of the beam. Generally, at least the outer and/or inner radial extent (commonly referred to as σ-outer and σ-winner, respectively) of the intensity distribution in a pupil plane of the illuminator may be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning means PW and position sensor IF (e.g. an interferometric device), the substrate table WT may be moved accurately, e.g. so as to position different target portions C in the path of the beam PB. Similarly, the first positioning means PM and another position sensor (which is not explicitly depicted in FIG. 1a) may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following preferred modes:

1. In step mode, the mask table MT and the substrate table WT are kept essentially stationary, while an entire pattern imparted to the projection beam is projected onto a target portion C in one action (i.e. a single static exposure). The substrate table WT is then shifted in the X and/or Y direction so that a different target portion C may be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes programmable patterning devices, such as a programmable mirror array.

Combinations and/or variations on the above described modes of use or entirely different modes of use may also be employed.

Figure 1B:
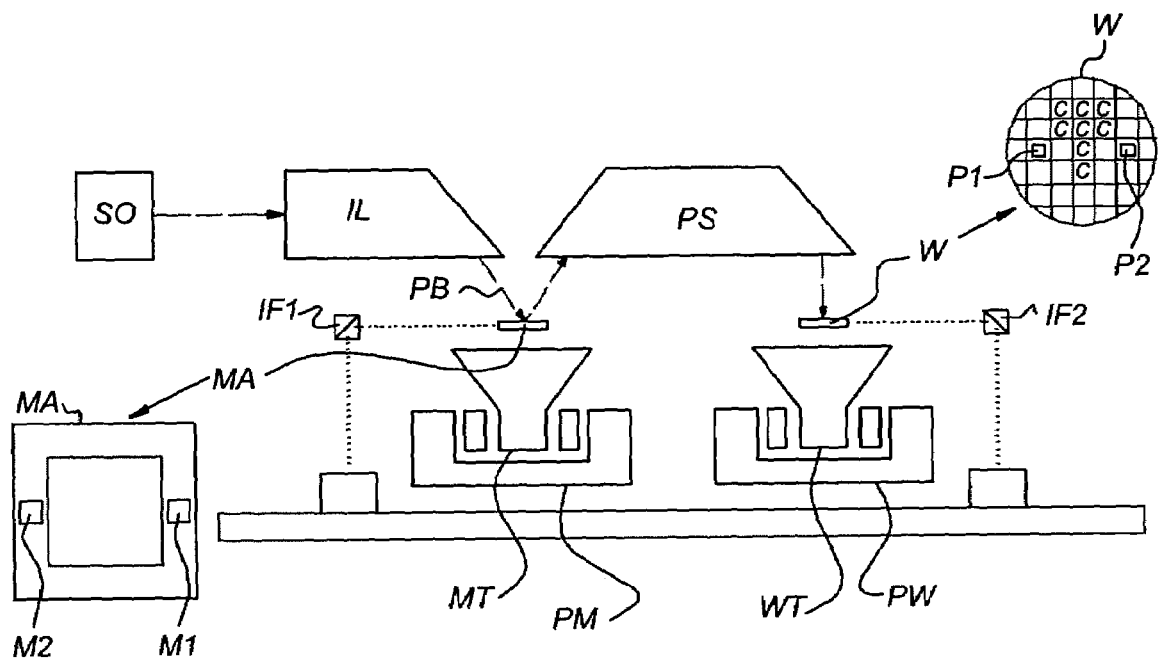
FIG. 1b illustrates a lithographic system according to another embodiment of the invention.

FIG. 1b schematically depicts a lithographic system according to another embodiment of the invention. The apparatus comprises:

an illumination system (illuminator) IL configured to condition a radiation beam B (e.g. EUV radiation).
a mask table MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask table MT supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask table MT may use mechanical, vacuum, electrostatic or other clamping techniques to hold the patterning device. The mask table MT may ensure that the patterning device is at a desired position, for example, with respect to the projection system.

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

According to an embodiment of the invention, the lithographic system comprises a processor CPU (central processing unit) as illustrated in FIG. 1a, arranged to calculate exposure corrections for the manufacture of a first substrate layer on top of a second substrate layer, using two height maps which are known a priori. The processor CPU is arranged to receive information from a height sensor LS which is arranged to measure a height of different positions of a substrate surface. Such a height sensor is, e.g., described in U.S. Pat. No. 5,191,200, hereby incorporated by reference in its entirety. The processor CPU is arranged to calculate overlay corrections using a reference height map representing a surface of the substrate table WT. The processor CPU may be arranged to produce the reference height map using information from, for example, the height sensor LS. Alternatively, the reference height map may be stored in a memory (not shown) which is accessible to, or comprised in, the processor CPU.

In an embodiment of the invention, the processor CPU is arranged to use the calculated overlay corrections to control the position of the substrate table WT and/or magnification settings of the projection system PL during exposures. The processor CPU may also be arranged to control the position of the mask table MT which is needed for asymmetric magnification corrections or asymmetric rotation corrections. All these corrections will be performed per exposure field, as will be explained below in more detail.

Figure 2:
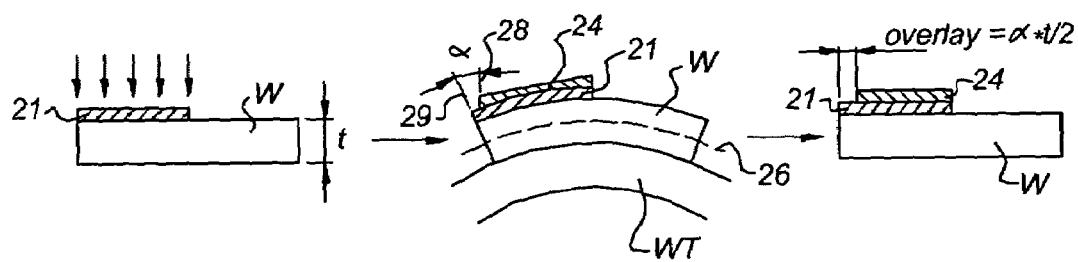
FIG. 2 illustrates a specific example of the impact of non-flat substrate table to a substrate.

FIG. 2 illustrates a specific example showing the impact of a (local) non-flat condition of a substrate table WT. A substrate layer 21 may be manufactured on a substrate W, as illustrated in the left image of FIG. 2. The substrate W may have a thickness t. For manufacturing another substrate layer 24 on top of the substrate layer 21, the substrate W may be placed on the substrate table WT, see center image of FIG. 2. In this example, the substrate table WT has a (local) non-flat condition as shown with exaggeration in the center image of FIG. 2. Due to the non-flat substrate table WT, the substrate W may be deformed, see FIG. 2. The pattern of the substrate layer 24 is determined by the mask MA and by the positioning of the substrate table WT with respect to the position of the mask MA. Even with perfect alignment, the substrate layer 24 may not be correctly positioned on substrate layer 21, see FIG. 2. In FIG. 2, a dashed line 26 is depicted indicating the middle of the substrate W. Furthermore, an angle α is depicted as being the angle between a line 28 parallel to the radiation direction and another line 29 perpendicular to the dashed line 26 at the position where first substrate layer 24 ends. When the substrate W has left the lithographic system, the substrate W will take its natural straight form. This means that substrate W will bend back, resulting in a situation shown in the right image of FIG. 2.

An overlay error is directly proportional to the local bending angle α and to the substrate thickness t. The overlay error induced by local bending (elastic deformation) of the substrate W may be calculated with the following formula, $$\text{Overlay} = \alpha \cdot \tfrac{1}{2} \cdot t \qquad (1)$$

where t represents the substrate thickness (e.g. 0.75 mm) and α is the local bending angle of the wafer. It is assumed that α is very small and that the thickness t of the substrate W is much larger than the thickness of the manufactured layers 21, 24. The factor ½ reflects the position of the neutral plane of the substrate (i.e. dashed line 26) that is bent over the non-flat substrate table surface. Empirical results show that this factor may be slightly different in practice.

Figure 3A:
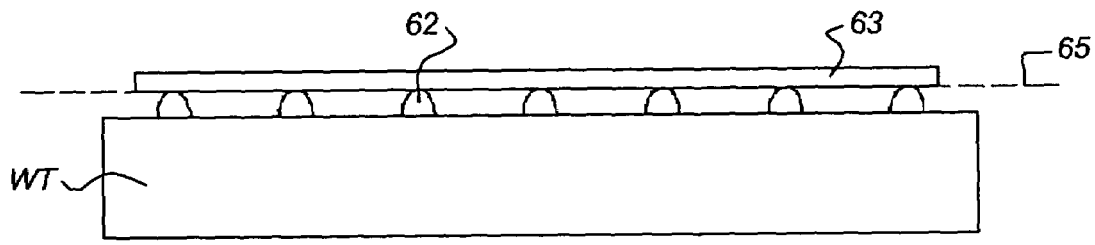
FIG. 3a shows a cross section of a flat substrate table.

FIG. 3a shows the substrate table WT in the ideal situation wherein the substrate table WT is perfectly flat. The substrate table WT comprises pimples 62 on which a test substrate 63 is positioned. Before exposure, a height of the upper surface of the test substrate 63 is measured by the height sensor LS as a function of location on the substrate, see FIG. 1. The height information is transmitted to the processor CPU which is arranged to construct and store a measured height map. The measured height map comprises the height of a plurality of points on the test substrate 63. The processor CPU is arranged to receive and store a priori information on the thickness of the test substrate 63 and is arranged to subtract the thickness t from the measured height map. The result is a height map of a virtual surface of the substrate table WT, referred to as reference height map. In FIG. 3a a dashed line 65 indicates the virtual surface of the substrate table WT. The reference height map may be determined a priori (i.e. before exposure). The information may be obtained in the exposure station using for example a dedicated flatness test measurement by means of a test substrate in the exposure station.

Figure 3B:
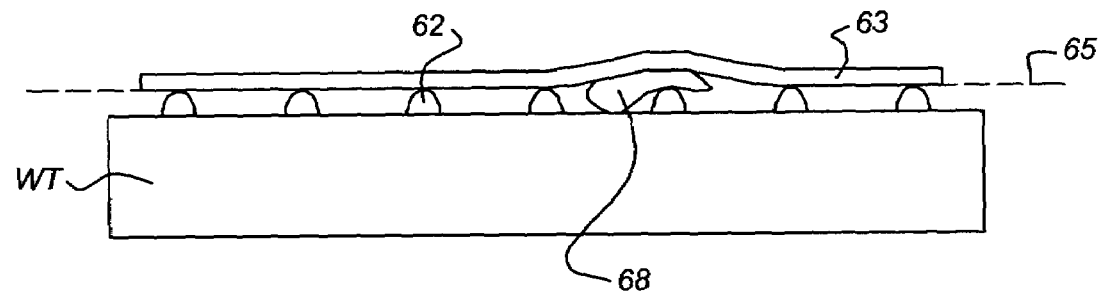
FIGS. 3b–3d shows possible causes for substrate table deformation.
Figure 3C:
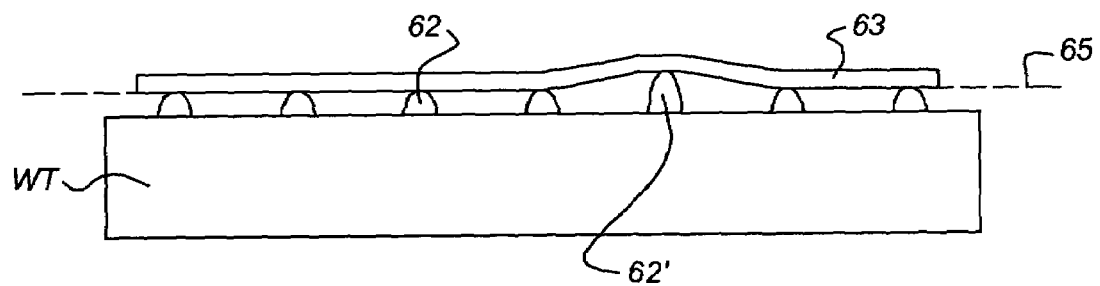
Figure 3D:
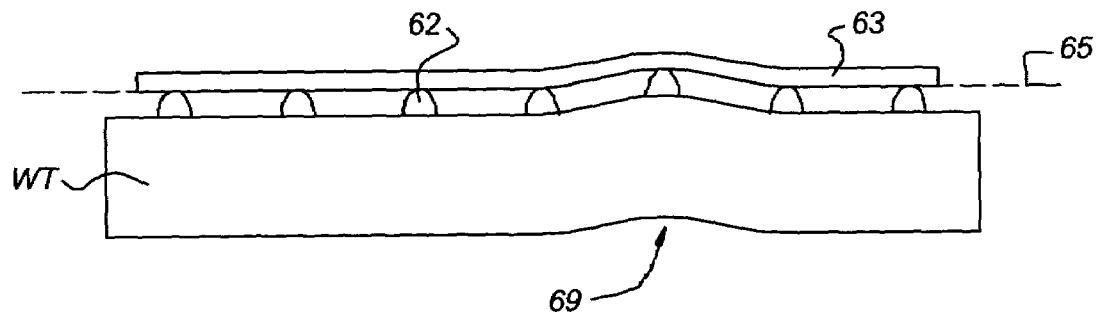

In FIGS. 3b–3d, three examples of possible causes for non-flat conditions of the substrate table WT are shown. In FIG. 3b, a particle 68 (i.e. dirt) is sandwiched between the substrate table WT and the test substrate 63. The particle 68 may cause the test substrate 63 to locally deform. The calculated virtual surface is shown by dashed line 65. In FIG. 3c another example is shown wherein one pimple 62' is larger than the other pimples 62. This will result in a local deformation of the test substrate 63. In FIG. 3d the substrate table itself is deformed, see 69, resulting in a deformation of the test substrate 63. It is observed that for reasons of clarity, the amount of non-flatness is shown strongly exaggerated in these figures.

The virtual surface 65 is used to correct for deformation of substrates to be processed every time the substrates are placed on a different substrate table. This may be the case whenever a substrate returns to a lithographic system, after being processed in another machine, such as a resist machine. Because in a manufacturing process many lithographic apparatus are used in parallel, a substrate passes many different substrate tables having different flatness conditions.

Figure 4:
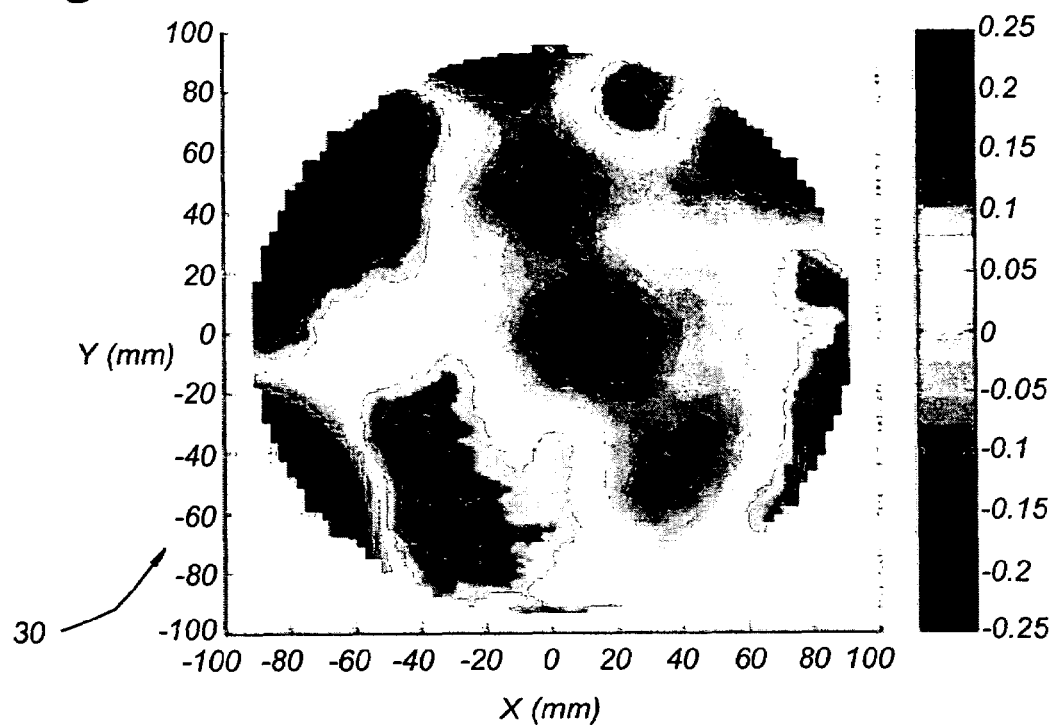
FIG. 4 shows a measured reference height map of a substrate table.

In FIG. 4, an example of a reference height map 30 is shown. Grey scales are used to indicate different heights of the reference height map 30. The processor CPU is arranged to use the reference height map 30 in order to calculate the amount of deformation at a plurality of grid points (i.e. points on the wafer grid). This is done by deriving for each of the grid points on the reference height map 30, local Rx and Ry tilt information. The first derivative of the reference height map 30 reflects the local bending angle. For each of a plurality of points (i,j) with i=1, 2, 3, ... and j=1, 2, 3, ..., on the surface, i.e. on the XY grid, a distortion vector $V_{ij}$ is calculated, wherein an x and y component of the distortion vector, i.e. $V_{ij}^x$ and $V_{ij}^y$, are determined by:

$$V_{ij}^x = d/dx(Sw(x,y,z)) \cdot k \cdot t$$

$$V_{ij}^y = d/dy(Sw(x,y,z)) \cdot k \cdot t$$

where Sw(x,y,z) is a function describing the reference height map in three dimensions, k is a constant and t is the thickness of the substrate.

The constant k is preferably between 0.4 and 0.7, more preferably between 0.4 and 0.6 and most preferably between 0.45 and 0.55.

Figure 5:
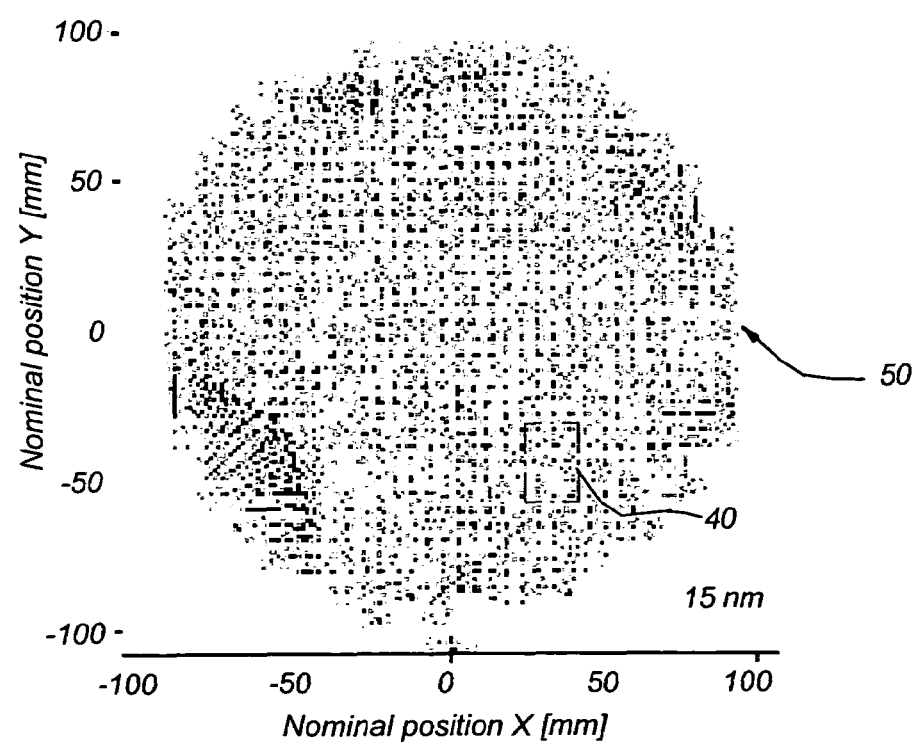
FIG. 5 illustrates a grid distortion vector field resulting from the reference height map of FIG. 4.
Figure 6:
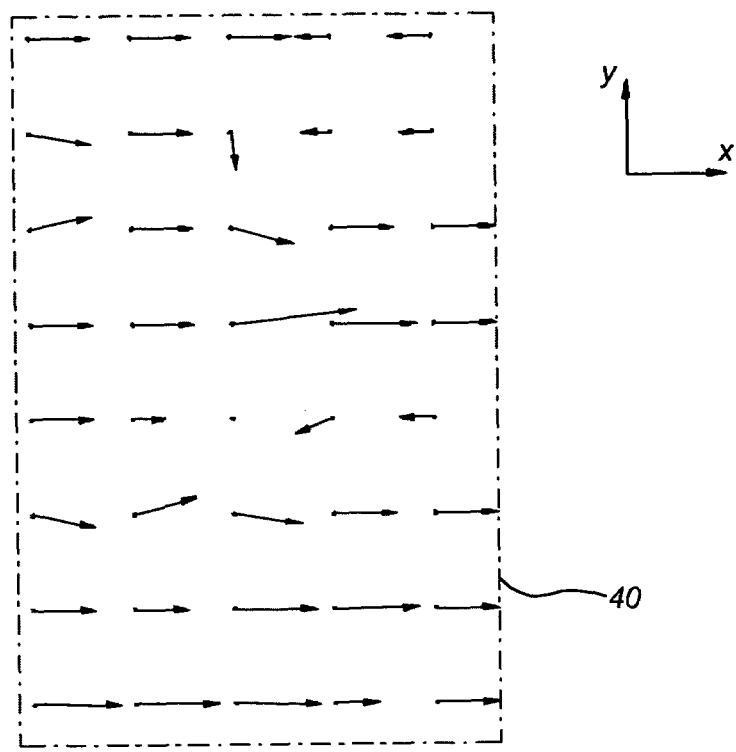
FIGS. 6 and 7 illustrate two examples of a grid distortion vector field within one exposure field.
Figure 7:
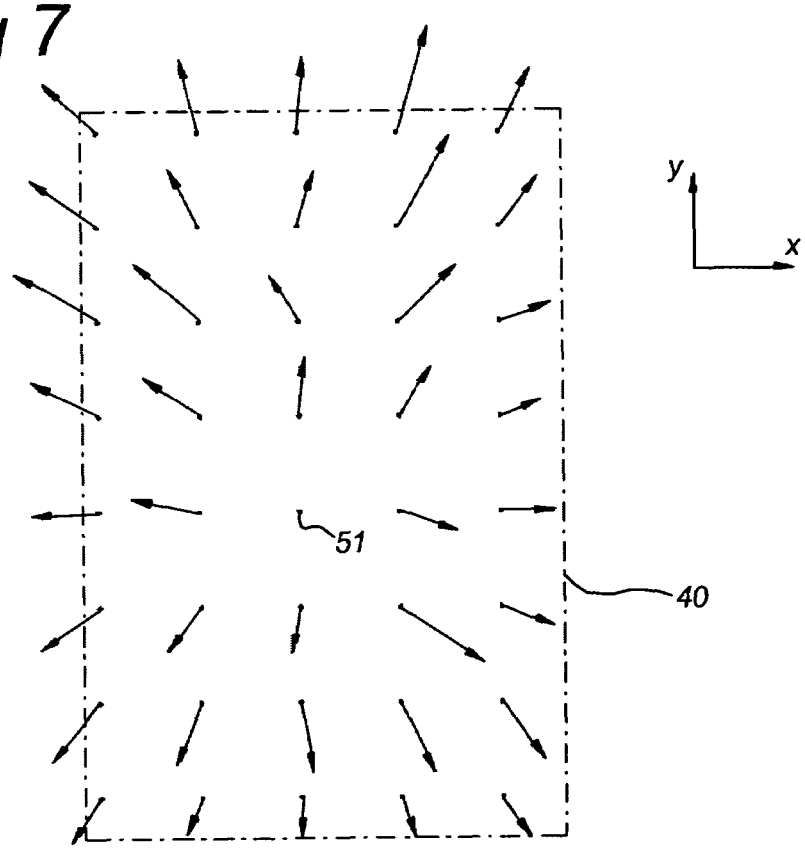

A grid distortion vector field 50 resulting from the reference height map 30 of FIG. 4 is shown in FIG. 5. According to an embodiment of the invention, the processor CPU uses the vectors of the grid distortion vector field 50 lying within a single exposure field 40, see FIG. 5, to determine the exposure corrections for that exposure field 40. Exposure corrections for alignment will include local position adjustments in terms of translation in the X- and Y-direction. These corrections are position dependent and they allow a more accurate absolute determination of grid parameters during wafer alignment. The exposure corrections are specific for each field 40 and include a translation in the X-direction, a translation in the Y-direction and possibly also symmetric or asymmetric magnification, symmetric rotation and asymmetric rotation, or higher order distortion terms (such as second order or third order distortions). In FIGS. 6 and 7, two examples of a grid distortion vector field within one exposure field 40 are shown. In FIG. 6, a majority of vectors point to the X direction. This means, that the processor CPU may produce an X shift for the substrate table WT in order to correct for overlay errors within this specific exposure field 40. In FIG. 7, the vectors diverge out of a central point 51. In this case, the processor CPU may produce a magnification correction for this particular exposure field, for example, by way of adjusting the lens when this particular exposure field is exposed.

The invention allows feed forward correction of non-flatness induced wafer grid distortion during alignment and during exposure, thereby reducing overlay errors caused by differences in flatness characteristics (chuck to chuck, machine to machine, or single chuck flatness changes over time). It provides an indirect qualification method for overlay accuracy related to exposure chuck flatness based on height map information.

According to another embodiment of the invention, the CPU is arranged to calculate overlay corrections caused by mask table non-flatness. This embodiment is particularly relevant for EUV systems wherein a mask is sucked onto a mask table instead of being clamped in a support (e.g. frame), as often is the case in non-EUV systems. In this embodiment, a reference height map of the surface of the mask table is determined in advance. This may be done using a special height sensor, which may be comprised in the lithographic system, not shown in FIG. 1b. The reference height map of the mask table MT may be used by the processor CPU to minimize overlay by adjusting settings of the lithographic system depending on non-flatness information of the mask table MT.

Figure 8:
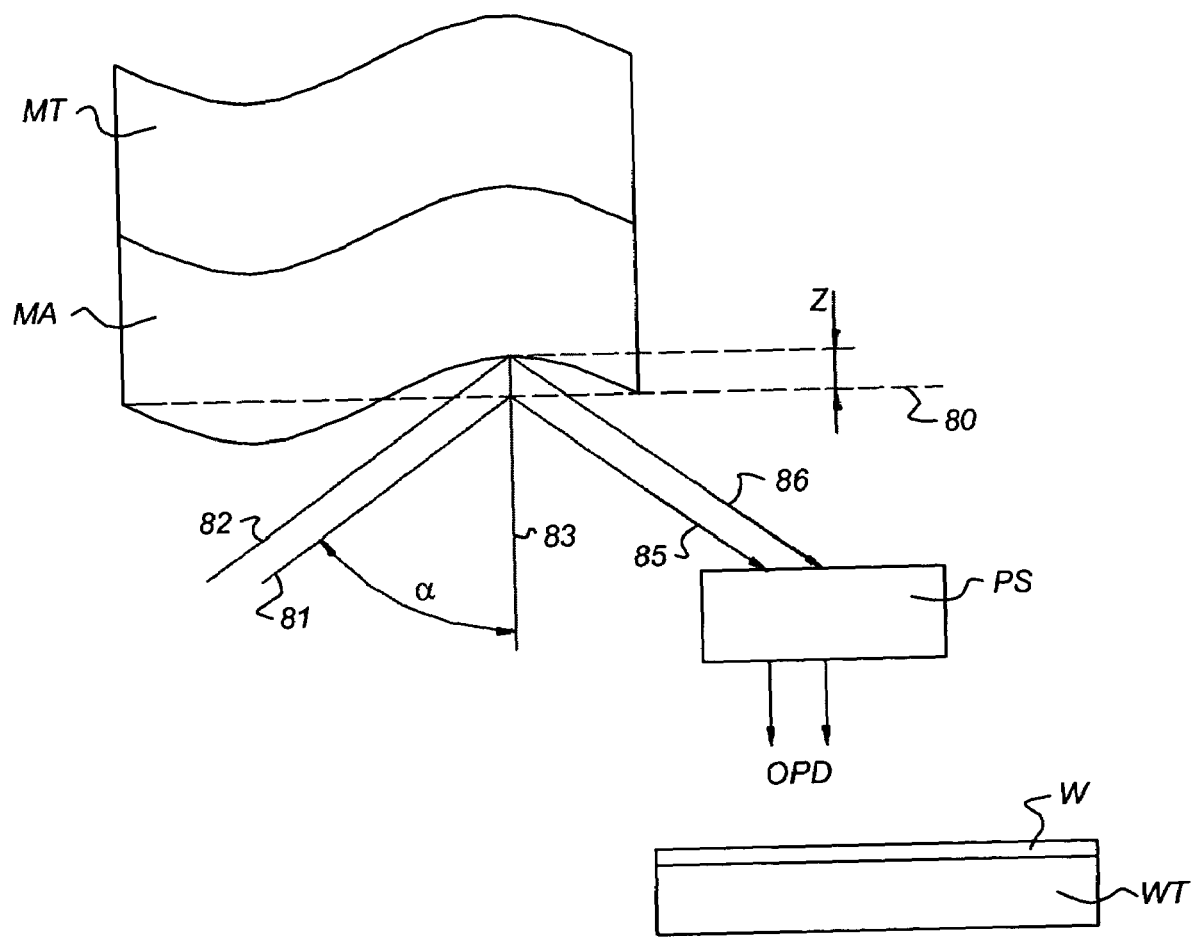
FIG. 8 illustrates a specific example of the impact of unflatness of a mask table to a substrate.

FIG. 8 shows a partial cross-section of the mask MA and the mask table MT. Note that as compared to FIG. 1b, the mask hangs upside down. Due to non-flat conditions of the mask table MT, the mask MA will also be non-flat. In FIG. 8, a fictional surface 80 of a perfectly flat mask surface is indicated by a dashed line 80. Two incoming radiation beams 81, 82 are indicated. The radiation beams 81, 82 make an angle α with respect to a perpendicular 83 of the fictional surface 80. If the mask were flat, the radiation beam 81 would be reflected as indicated by reflected beam 85, thereby patterning the radiation beam with detail present on the mask MA at the position where the perpendicular 83 is drawn. Since the mask surface is not flat, detail of the mask MA may be patterned by a beam 82, see FIG. 8. Note that the beam 81 and the beam 82 are the same beam as was indicated by B in FIG. 1b. Beam 82 is reflected by the mask MA to render a reflected beam 86. Both reflected beam 85, 86, respectively, will reach the projection system PS. Reflected beam 85, 86 are also referred to as patterned beams. The projection system PS will project the patterned beam onto the substrate W, as is shown in FIG. 1b. The projection system PS is arranged to magnify details of the mask MA with a magnification factor m of typically ¼. According to an embodiment, the processor CPU is arranged to calculate for each of a plurality of points (i,j), with i=1, 2, 3, . . . and j=1, 2, 3, . . . , on the surface of said mask table MT a out of plane distance $OPZ_{ij}$ which is determined by:

$$OPZ_{ij}=Sm(x,y,z)-Sm_{mean},$$

with Sm(x,y,z) being a function describing the reference height map of the mask table MT in all three dimensions, and $S_{mean}$ is a mean value of Sm(x,y,z) for all (i,j). Note that Smean is not the dashed line 80 of FIG. 8.

The processor CPU then calculates for each of the points (i,j) an out of plane deviation/distortion vector $OPD_{ij}$, wich is determined by:

$$OPD_{ij}=m \cdot OPZ_{ij} \cdot \tan(\alpha),$$

with m a magnification factor of the projection system PS, and α the angle between the perpendicular 83 of said mask table MT and said projection beam 81, 82.

Instead of using the surface Sm(x,y,z) of the mask table MT, the actual surface of the mask MA may be used. In that case, the contribution of the non-flatness of the mask MA also may be taken into account. In many cases, the amount of non-flatness of the mask MA is even bigger than the contribution of the non-flatness of the mask table MT.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A lithographic system, comprising:
   an illumination system for providing a projection beam of radiation;
   a mask table for supporting a patterning device, the patterning device serving to impart a cross-section of the projection beam with a pattern;
   a substrate table for holding a substrate; and
   a processor configured to calculate overly corrections using at least one of a first reference height map representing a surface of said substrate table and a second reference height map representing a surface of said mask table.

2. The system according to claim 1, further comprising a height sensor that measures a height of different positions of at least one of said substrate table surface and said mask table surface, and wherein the processor is configured to receive information from said height sensor.

3. The system according to claim 1, wherein the processor determines a distortion vector $V_{ij}$ for each of the plurality of locations on the substrate table surface, wherein (i,j) represent integers and wherein the distortion vector includes x and y components $V_{ij}^{x}$ and $V_{ij}^{y}$, respectively, that are determined by:

$$V_{ij}^{x}=d/dx(S(x,y,z)) \cdot k \cdot t, \text{ and}$$

$$Vijy=d/dy(S(x,y,z)) \cdot k \cdot t,$$

where S(x,y,z) describes the first references height map in three dimensions, k is a constant and t is a thickness of the substrate.

4. The system according to claim 3, wherein a value for constant k lies between 0.4 and 0.7.

5. The system according to claim 3, wherein a value for constant k lies between 0.4 and 0.6.

6. The system according to claim 3, wherein a value for constant k lies between 0.45 and 0.55.

7. The system according to claim 1, wherein the processor calculates the overlay corrections for exposure fields on the substrate using distortion vectors that lie within the exposure field.

8. The system according to claim 1, wherein the overlay corrections comprise at least one of a translation in an X direction, a translation in a Y direction, symmetric magnification, asymmetric magnification, symmetric rotation, and asymmetric rotation.

9. The system according to claim 1, wherein the height sensor is configured to measure a height of a plurality of points on a surface of a calibration substrate.

10. The system according to claim 1, further comprising a projection system and wherein the processor is arranged to control at least one of settings of the projection system, and a position of the substrate table with respect to a patterning device, based on the overlay corrections.

11. The system according to claim 1, wherein the processor is arranged to calculate an out of plane distance $OPZ_{ij}$ for each of a plurality of locations on the mask table surface, wherein (i,j) represent integers, and wherein the out of plane distance OPZij is determined by:

$$OPZij=S(x,y,z)-S_{mean},$$

with S(x,y,z) describing the second reference height map in three dimensions, and $S_{mean}$ is a mean value of S(x,y,z) for all (i,j), the processor being further adapted to calculate for each of the plurality of locations, an out of plane deviation/distortion vector $OPD_{ij}$, that is determined by:

$$OPD_{ij} = m \cdot OPZ_{ij} \cdot \tan(\alpha),$$

with m being a magnification factor of a projection system used between the mask table and the substrate table, and $\alpha$ being an angle measured between a perpendicular to the mask table and a projection beam of radiation.

12. A method of adjusting a lithographic system to account for surface conditions of at least one of a substrate table and a mask table, comprising the steps of:
- determining a substrate table surface height at a plurality of points on the substrate table;
- creating a substrate table height map based on the substrate table surface height;
- determining a mask table surface height at a plurality of points on the mask table;
- creating a mask table height map based on the mask table surface height;
- calculating surface flatness corrections using at least one of the substrate table height map and the mask table height map;
- controlling at least one of a position of the substrate table and a magnification setting of a projection system using the surface flatness corrections; and
- projecting a patterned beam of radiation onto a target portion of a substrate placed on the substrate table.

13. A computer-readable medium encoded with a computer program for adjusting a lithographic system to account for surface conditions of at least one of a substrate table and a mask table comprising:
- computer readable code for obtaining a substrate table surface height at a plurality of points on the substrate table;
- computer readable code for creating a substrate table height map based on the substrate table surface height;
- computer readable code for obtaining a mask table surface height at a plurality of points on the mask table;
- computer readable code for creating a mask table height map based on the mask table surface height;
- computer readable code for calculating surface flatness corrections using at least one of the substrate table height map and the mask table height map;
- computer readable code for controlling at least one of a position of the substrate table and a magnification setting of a projection system using the surface flatness corrections; and
- computer readable code for projecting a patterned beam of radiation onto a target portion of a substrate placed on the substrate table.

* * * * *